United States Patent [19]
Soltner et al.

[11] Patent Number: 5,430,014
[45] Date of Patent: Jul. 4, 1995

[54] METHOD OF PRODUCING AN SRTIO3/YBA2CU3O7 LAYER SYSTEM AND A LAYER SYSTEM AS THUS PRODUCED AS A HIGH-TEMPERATURE SUPERCONDUCTOR

[75] Inventors: Helmut Soltner, Inden; Ulrich Poppe, Köln; Knut Urban, Jülich, all of Germany

[73] Assignee: Forschungszentrum Julich GmbH, Julich, Germany

[21] Appl. No.: 61,715

[22] Filed: Oct. 30, 1992

[30] Foreign Application Priority Data

Nov. 2, 1991 [DE] Germany ............... 41 36 126.1

[51] Int. Cl.6 ............... H01L 39/00; C23C 14/34
[52] U.S. Cl. ............... 505/238; 505/190; 505/329; 505/475; 505/701; 505/702; 505/731; 427/62; 427/419.3; 428/702; 428/930; 204/192.24
[58] Field of Search ............... 505/1, 701, 702, 730, 505/731, 238, 190, 329, 475; 427/62, 63, 419.2, 419.3; 257/33, 35; 428/930, 702; 204/192.24

[56] References Cited

FOREIGN PATENT DOCUMENTS

0445350A2 9/1991 European Pat. Off. .
467777A2 1/1992 European Pat. Off. .
4136126A1 5/1993 Germany .

OTHER PUBLICATIONS

Fink et al, "Hysteretic Josephson Junctions from $YBa_2Cu_3O_{7-x}/SrTiO_3/Ba_{1-x}K_xBiO_3$ trilayer films", Appl. Phys. Lett. 61(5) Aug. 1992 pp. 595–597.
Kingston et al, "Multilayer $YBa_2Cu_3O_x$–$SrTiO_3$–$YBa_2Cu_3O_x$ Films for Insulating Crossovers", Appl. Phys. Lett. 56(2), Jan. 1990, pp. 189–191.
Mohammed E. Tidjani et al "Heteroepitaxial $YBa_2Cu_3O_{7-x}SrTiO_3$ . . . " Appl. Phys. Lett. 58 (7), 18 Feb. 1991, pp. 765–767.

Primary Examiner—Roy V. King
Attorney, Agent, or Firm—Herbert Dubno

[57] ABSTRACT c-axis oriented $YBa_2Cu_3O_7$ layers are grown with intervening $SrTiO_3$ layers bridged over steps at which there is a transformation to a-axis crystal-oriented growth. The multilayer superconductor has $YBa_2Cu_3O_7$ layers which are not thicker than 500 nm while the intervening layers of $SrTiO_3$ have thicknesses of 20 to 30 nm.

4 Claims, 2 Drawing Sheets

METHOD OF PRODUCING AN SRTIO₃/YBA₂CU₃O₇ LAYER SYSTEM AND A LAYER SYSTEM AS THUS PRODUCED AS A HIGH-TEMPERATURE SUPERCONDUCTOR

FIELD OF THE INVENTION

Our present invention relates to a method of producing a multilayer high-temperature superconductor, i.e. a superconductor effective at the temperature of liquid nitrogen or thereabove, and especially a layer system of $SrTiO_3$ and $YBa_2Cu_3O_7$. More specifically, the invention relates to a layer system having a substrate with c-axis crystal-oriented $YBa_2Cu_3O_7$ layers thereon and to a layer system or stack as made by the new method.

BACKGROUND OF THE INVENTION

High temperature superconductor systems in which a $YBa_2Cu_3O_7$ layer with a c-axis crystal orientation with copper oxide planes parallel to the substrate surface are of interest for current transport at especially high current densities. For this purpose, the $YBa_2Cu_3O_7$ layer can be grown with a c-axis orientation.

There are various processes known for effecting the growth of $YBa_2Cu_3O_7$ layers with a c-axis orientation on an appropriate substrate. For example, high pressure dc sputtering can be used to deposit the $YBa_2Cu_3O_7$ layers with a c-axis orientation. The type of crystal grown depends upon geometric conditions, pressure of the sputtering gas, furnace temperature and substrate temperature, choice of substrate and of sputtering gas and the current density during the sputtering.

However, even with an optimum choice of all of these parameters in prior systems, it has been found that with increasing layer thicknesses, the growth of a-axis crystal oriented regions cannot be avoided.

Once c-axis crystal oriented regions arise, they increasingly prevent uniform a-axis oriented growth. Until now there has been no solution to this problem.

OBJECTS OF THE INVENTION

It is the principal object of the present invention, therefore, to provide a process which enables a controlled c-axis oriented $YBa_2Cu_3O_7$ growth for use of the crystal structure as a high structure superconductor, whereby the c-axis crystal orientation regions predominate and whereby disadvantages of the prior art system can be avoided.

It is also an object of this invention to provide a superconductor stack of layers in which c-axis crystal-oriented $YBa_2Cu_3O_7$ layers predominate and wherein the formation of a-axis crystal-oriented regions is largely suppressed.

A further object of this invention is to provide an improved method of making a superconductor crystal stack whereby drawbacks of earlier systems are eliminated.

SUMMARY OF THE INVENTION

Surprisingly, we have found that the drawbacks of earlier systems can be obviated in the growth of $YBa_2Cu_3O_7$ layers with a c-axis crystal orientation when, upon the development of undesirable a-axis oriented regions and thus steps between a-axis and c-axis oriented regions which interrupt the c-axis $YBa_2Cu_3O_7$ layer, a $SrTiO_3$ layer is deposited over the step and the $YBa_2Cu_3O_7$ until the step is covered by the $SrTiO_3$ layer and thereafter the growth of the $YBa_2Cu_3O_7$ with the c-axis crystal orientation is continued.

More particularly, the method of the invention for producing a multilayer high-temperature superconductor comprises the steps of:

(a) growing a c-axis crystal-oriented $YBa_2Cu_3O_7$ layer upon a substrate until formation of an a-axis crystal oriented region occurs;

(b) upon formation of the a-axis crystal oriented region and development of steps between a-axis crystal-oriented and c-axis crystal-oriented regions on a $YBa_2Cu_3O_7$ surface of the layer, interrupting growth of the c-axis crystal-oriented $YBa_2Cu_3O_7$ layer;

(c) upon interruption in growth of the c-axis crystal-oriented $YBa_2Cu_3O_7$ layer in step (b), applying an $SrTiO_3$ layer to the surface until the steps are covered; and (d) thereafter continuing the growth of the c-axis crystal-oriented $YBa_2Cu_3O_7$ layer upon the $SrTiO_3$ layer, thereby forming a stack of layers.

Steps (b) and (d) can be repeated until the stack has a multiplicity of $SrTiO_3$ layers alternating with the $YBa_2Cu_3O_7$ layers.

The invention is based upon the discovery that the hitherto unavoidable uncontrolled growth of a-axis crystal-oriented $YBa_2Cu_3O_7$ can be avoided when relatively large layer thickness of $YBa_2Cu_3O_7$ layers by incorporating into them intervening layers which allow further controlled c-axis oriented growth. The $SrTiO_3$ layers have been found to be ideal for this purpose.

Advantageously, the $YBa_2Cu_3O_7$ is grown only to layer thicknesses of 500 nm before a $SrTiO_3$ layer is applied and further c-axis crystal-oriented $YBa_2Cu_3O_7$ growth is effected.

It has been found, further, that thicknesses of 20 nm to 30 nm $SrTiO_3$ layers suffice to allow further c-axis oriented crystal growth of the $YBa_2Cu_3O_7$.

A high-temperature superconductor which has, therefore, far more c-axis crystal-oriented $YBa_2Cu_3O_7$ regions than hitherto has been the case can thus be obtained in the form of a multilayer stack with alternating $YBa_2Cu_3O_7$ and $SrTiO_3$ layers whereby each $SrTiO_3$ layer of a thickness of 20 to 30 nm is sandwiched between two $YBa_2Cu_3O_7$ layers.

The $YBa_2Cu_3O_7$ layers preferably have thicknesses between 300 nm and 500 nm.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
FIG. 1 is an electron microscope micrograph of an $SrTiO_3$ $YBa_2Cu_3O_7$—layer system embodying the principles of the invention and showing in section the various layers.

In FIG. 1 of the drawing, in which the substrate itself is not visible, a first $YBa_2Cu_3O_7$ layer 1 of uncontrolled growth is provided and is covered by an $SrTiO_3$ coating 2 of several nm in thickness. A further uncontrolled growth $YBa_2Cu_3O_7$ layer 3 is applied thereto and is covered by a c-axis crystal-oriented $YBa_2Cu_3O_7$ layer 7.

c-axis oriented regions appear in the illustration for transverse lines and a-axis oriented regions with longitudinally-extending lines, i.e. lines perpendicular to the layer 5. The $SrTiO_3$ layer of 20 to 30 nm in thickness can bridge the step 6 and enable uniform growth of the c-axis $YBa_2Cu_3O_7$ layer. The thinner layer 2 of $SrTiO_3$ is not able to bridge the step 4 and thus from this step there is further a-axis crystal-oriented growth. By way of example, the application of the $YBa_2Cu_3O_7$ layer was effected by high pressure dc sputtering under the following conditions:

single stoichiometric target of a diameter of 35 mm and thus a composition of $YBa_2Cu_3O_7$;
(100)—oriented $SrTiO_3$ crystal as substrate;
13 mm distance between target and substrate;
oxygen as the sputtering gas with a pressure of 3.6 m bar;
furnace temperature of 880° C.;
surface temperature of substrate 750° C.;
current amplitude during sputtering 200 mA; and
oxygen after treatment at 550° C.

The $SrTiO_3$ layers were applied by high-frequency sputtering using a sinusoidal voltage at 1000 volts, an alternating current frequency of 7 MHz and otherwise the same conditions except for the use of an $SrTiO_3$ target.

Figure 2:
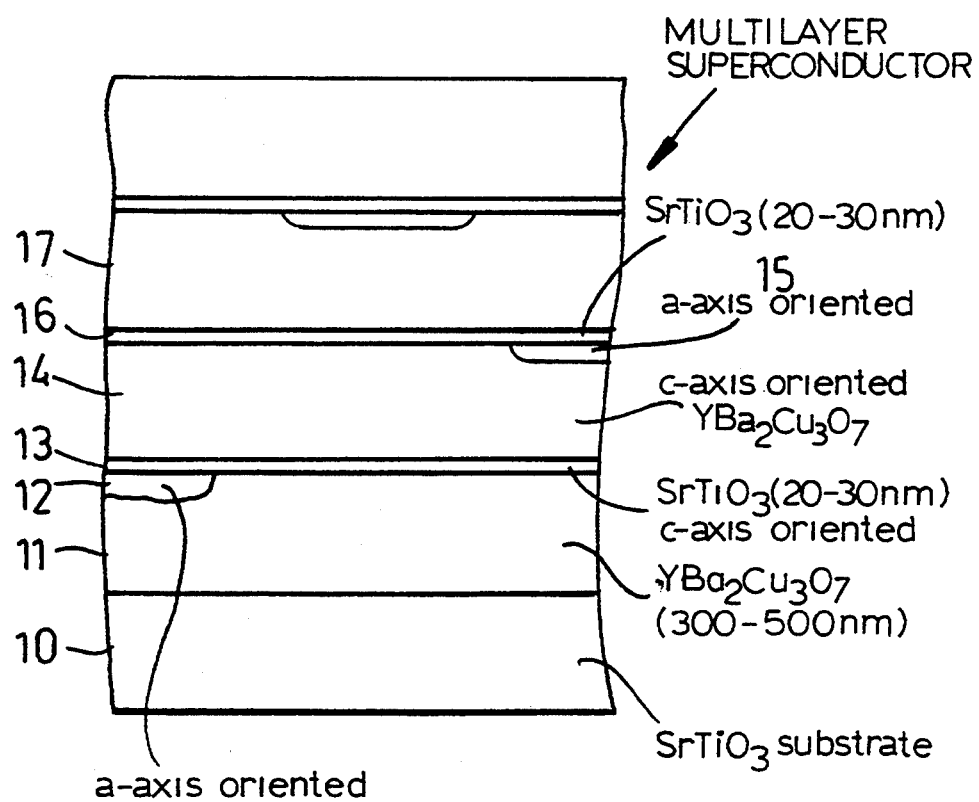
FIG. 2 is a diagrammatic cross sectional view showing a superconductor stack according to the invention.

In FIG. 2 we have shown the substrate 10 of $SrTiO_3$, a layer 11 of $YBa_2Cu_3O_7$ on which an a-axis oriented step 12 has grown, the $SrTiO_3$ layer 13 another c-axis oriented $YBa_2Cu_3O_7$ layer 14 on which an a-axis step 15 has begun to grow, a further $SrTiO_3$ layer 16 of 20 to 30 nm in thickness and a successive c-axis $YBa_2Cu_3O_7$ crystal-oriented layer 17 forming the superconductor.

We claim:

1. A method of producing a multilayer high temperature superconductor, comprising the steps of:
   (a) growing a c-axis crystal-oriented $YBa_2Cu_3O_7$ layer upon a substrate until formation of an a-axis crystal oriented region occurs;
   (b) upon formation of said a-axis crystal oriented region and development of steps between a-axis crystal-oriented and c-axis crystal-oriented regions on a $YBa_2Cu_3O_7$ surface of said layer, and, after the growth of said c-axis crystal oriented $YBa_2Cu_3O_7$ layer to a thickness of at least 300 nm and not more than 500 nm, interrupting growth of the c-axis crystal-oriented $YBa_2Cu_3O_7$ layer;
   (c) upon interruption in growth of the c-axis crystal-oriented $YBa_2Cu_3O_7$ layer in step (b), applying a $SrTiO_3$ layer in a thickness of at least 20 nm and at most about 30 nm to said surface until said steps between a-axis and c-axis regions are covered; and
   (d) thereafter continuing the growth of said c-axis crystal-oriented $YBa_2Cu_3O_7$ layer upon the $SrTiO_3$ layer, thereby forming a stack of layers.

2. The method defined in claim 1 wherein steps (b) through (d) are repeated until said stack has a multiplicity of said layers formed therein.

3. The method defined in claim 1 wherein said stack is formed with a multiplicity of alternating $SrTiO_3$ layers and $YBa_2Cu_3O_7$ layers and each $SrTiO_3$ layer lying between two $YBa_2Cu_3O_7$ layers has a thickness of 20 to 30 nm.

4. A multilayer high temperature superconductor made according to claim 1, comprising a multiplicity of alternating $SrTiO_3$ layers and superconductive $YBa_2Cu_3O_7$ layers, each $SrTiO_3$ layer lying between two $YBa_2Cu_3O_7$ layers having a thickness of 20 to 30 nm, wherein said $YBa_2Cu_3O_7$ layers having thicknesses between 300 nm and 500 nm.

* * * * *